US005973389A

United States Patent [19]

Culnane et al.

[11] Patent Number: 5,973,389

[45] Date of Patent: Oct. 26, 1999

[54] SEMICONDUCTOR CHIP CARRIER ASSEMBLY

[75] Inventors: Thomas M. Culnane, Susushanna, Pa.; Michael A. Gaynes, Broome, N.Y.; Ramesh R. Kodnani, Broome, N.Y.; Mark V. Pierson, Broome, N.Y.; Charles G. Woychik, Broome, N.Y.

[73] Assignee: International Business Machines Corporation, Armonk, N.Y.

[21] Appl. No.: 08/844,865

[22] Filed: Apr. 22, 1997

[51] Int. Cl.[6] .......... H01L 23/02

[52] U.S. Cl. .......... 257/678; 257/669; 257/676; 257/738; 257/701

[58] Field of Search .......... 257/666, 669, 257/678, 630, 632, 737, 738, 753, 773, 774, 676, 701; 361/658, 704, 705, 707, 712, 713, 720, 721, 722, 740, 749, 750, 751; 29/840, 852

[56] References Cited

U.S. PATENT DOCUMENTS

| | | | |
|---|---|---|---|
| 4,687,280 | 8/1987 | Toy | 29/859 |
| 5,386,341 | 1/1995 | Olson et al. | 361/749 |
| 5,435,732 | 7/1995 | Angulas et al. | 29/840 |
| 5,438,223 | 8/1995 | Higashi et al. | 257/774 |
| 5,512,360 | 4/1996 | King | 428/304.4 |
| 5,611,884 | 3/1997 | Bearinger et al. | 257/778 |
| 5,760,465 | 6/1998 | Alcoe et al. | 257/669 |

*Primary Examiner*—Minh Loan Tran
*Assistant Examiner*—Luan Thai
*Attorney, Agent, or Firm*—Scully, Scott, Murphy, Presser; John Pivnichny

[57] ABSTRACT

A semiconductor chip carrier assembly which includes a flexible substrate having a metallicized path on one of its surfaces in electrical communication with a semiconductor chip. A stiffener is disposed adjacent to said flexible substrate and is bonded thereto by an adhesive composition. The adhesive composition which comprises a microporous film laden with a curable adhesive is disposed between the flexible substrate and the stiffener. A cover plate is adhesively bonded to the semiconductor chip and to the stiffener. A process of making the assembly involving disposition of the flexible substrate in a vacuum fixture upon which the adhesive composition and stiffener is placed followed by the application of heat and pressure to cure the curable adhesive is also described.

14 Claims, 1 Drawing Sheet

SEMICONDUCTOR CHIP CARRIER ASSEMBLY

BACKGROUND OF THE DISCLOSURE

1. Field of the Invention

The present invention is directed to a semiconductor chip carrier assembly and a process for making that assembly. More particularly, the present invention is directed to a chip carrier assembly utilizing a microporous film adhesive to bond the flexible circuit and the stiffener members.

2. Field of the Prior Art

It is well known in the art to electrically connect a semiconductor chip to a circuit board by employing a carrier structure for the semiconductor chip. One well accepted chip carrier assembly design for providing this electrical connection is a tape ball grid array type assembly (TBGA). A TBGA assembly is electrically connected to a circuit board by means of solder balls. This electrical connection is accomplished by connecting the solder balls of the chip assembly to electrical connecting pads on the circuit board.

The aforementioned assembly requires the inclusion of a metal stiffener to provide adequate structural support for the very thin polyimide tape which constitutes the flexible circuit substrate.

A chip carrier assembly stiffener is bonded to the polyimide tape substrate by means of an adhesive. One commonly employed adhesive is fiberglass reinforced pressure sensitive acrylic that acts not only as an adhesive but also as an electric insulating barrier to prevent solder rivets from electrically communicating with the stiffener. Unfortunately, acrylic film adhesives, although somewhat conformable, do not entirely conform around the protruding solder rivets. As such, the use of acrylic film adhesives oftentimes result in the formation of pockets of air around the base of the rivets. Although this film adhesive is designed to overcome this problem, insofar as it is characterized by an embossed pattern to channel out air during assembly, air may still be entrapped between the flexible circuit and the adhesive.

The entrapment of air between the flexible circuit and the adhesive serves as a channel which permits the introduction of moisture. As those skilled in the art are aware, moisture causes corrosion failures and/or delamination during solder reflow. To avoid this, semiconductor chip assemblies that employ pressure sensitive acrylic film adhesives include the further processing step, prior to solder reflow, of baking the assembly.

There are additional detrimental aspects relating to the use of pressure sensitive film acrylic adhesives in chip carrier assemblies. Upon curing of the acrylic based adhesive, benzene vapor is produced as a by-product. This outgassing of benzene, a well-established carcinogen, represents an important health hazard.

Another adverse feature of commonly employed pressure sensitive film acrylic adhesives is the inclusion therein of metal oxide particles. The presence of metal oxide particles in acrylic adhesives represents a reliability hazard insofar as it can potentially lead to shorting out of the assembly.

Yet another detrimental result of employing pressure sensitive acrylic film adhesives is their tendency to oxidize upon exposure to long term temperature aging. Exposure of the assembly to this high temperature for this long duration leads to oxidation problems and has a long term detrimental effect upon the chip assembly.

U.S. Pat. No. 5,512,360 describes a prepreg adhesive composite formed from a porous polymeric substrate providing good adhesion, low dielectric constant and low modulus. The composite comprises at least one layer of an expanded polytetrafluoroethylene having an initial void volume of at least 50% to 95% and containing between 15% and 40% by weight, based on the total weight of the composite, of adhesive to form an uncured prepreg that eliminates or substantially reduces adhesive on the exterior, outer surfaces of the expanded polymeric structure. The composite of this patent is employed to make printed circuit boards as well as microwave substrates.

BRIEF SUMMARY OF THE INVENTION

A new semiconductor chip carrier assembly has now been developed which includes an adhesive to bond the flexible substrate to the stiffener which overcomes the problems associated with adhesives employed in the prior art. Although the adhesive of the present invention is a solid it is highly conformable around solder rivet heads and circuit lines included on the flexible substrate. Furthermore, the film adhesive is porous so that air can escape from between the flexible substrate and the adhesive, eliminating air therebetween.

In addition, the adhesive has a low modulus of elasticity which, when combined with its high degree of conformability, results in the absence of mechanical strains. Upon curing, no toxic and/or carcinogenic vapor, such as benzene, is exuded. Moreover, the problem associated with oxidation, resulting from long term temperature aging, is considerably reduced due to the low concentration of ionic components in the adhesive. Finally, another problem usually associated with long term curing, its considerable duration, is reduced because of the shorter curing period associated with the curable resin employed in the adhesive composition of the present invention.

In accordance with the present invention, a semiconductor chip carrier assembly is provided. The assembly includes a flexible substrate having a first and a second surface, the first surface including metallicized paths to provide electrical conductivity therethrough. The first surface is also provided with electrical conductive rivets. The second surface of the flexible substrate includes electrically conductive members for electrical communication with a circuit board. The assembly further includes a semiconductor chip in electrical communication with the flexible substrate. A stiffener is included to support the flexible substrate. The stiffener, having a first and a second surface, is disposed such that the first surface of the stiffener is adjacent the surface of the flexible substrate. An adhesive comprising a microporous film laden with a curable thermosetting resin is disposed between the first surface of the stiffener and the first surface of the flexible substrate. A cover plate, adhesively bonded to the semiconductor chip and to the second surface of the stiffener, is also included.

In further accordance with the present invention, a process for making the aforementioned semiconductor chip carrier assembly is disclosed. In this process a flexible substrate is introduced into a vacuum fixture, said fixture having openings to accommodate irregularities on the bottom surface of the substrate. A vacuum is applied to hold said flexible substrate flat on said vacuum fixture. An adhesive composition comprising a microporous film substrate and a curable adhesive is placed over the flexible substrate. A stiffener is disposed over the adhesive composition. The assembly is bonded by curing the curable adhesive by subjecting the assembly to a temperature in the range of between about 140° C. and about 200° C. and a pressure of between about 50 psi and about 1000 psi.

BRIEF DESCRIPTION OF THE DRAWINGS

The present invention will be better understood by reference to the accompanying drawings of which.

DETAILED DESCRIPTION

Figure 1:
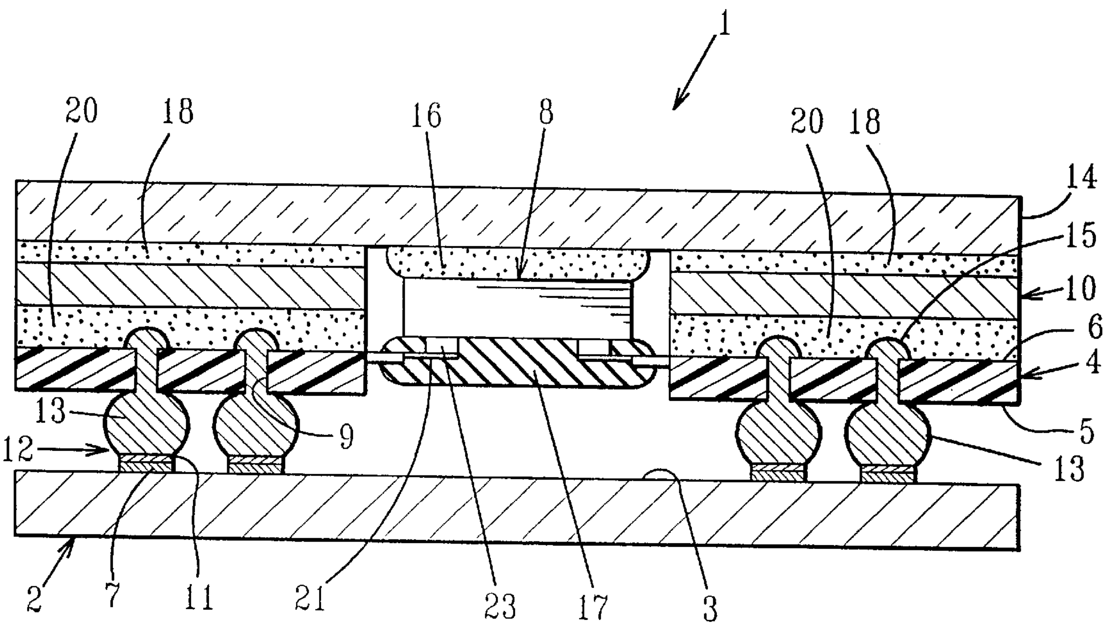
FIG. 1 is a cross-sectional elevation view of the chip carrier assembly.

The semiconductor chip carrier assembly of the present invention is generally indicated at 1. The assembly 1 includes a flexible substrate 4. Flexible substrate 4 is provided with a plurality of openings 9. These openings 9, commonly referred to as vias, are provided for fastening of electrical communication members, discussed below. The flexible circuit 4 is formed from a non-electrically conductive thin film. The film is usually a high temperature resistant plastic, preferably a thermosetting plastic such as a polyimide. In a preferred embodiment, the film has a thickness in the range of between about 40 to about 60 microns, more preferably, about 50 microns.

The flexible substrate 4 is circuitized by evaporative or sputter metallization of the non-conductive plastic to provide a thin layer of a conductive metal on both first and second surfaces of the film. The thin layer is then subjected to electroplating to set up circuit lines having a height of about 15 to about 25 microns. The first surface of the flexible substrate 4, denoted in the drawings at 6, in addition to being provided with an electrical circuit, also includes electrically conductive protrusions 15, commonly referred to as rivets.

The flexible substrate 4, which is often referred to as a flexible circuit, or, more simply, a flex circuit, in view of the inclusion of electrical conductive paths on first surface 6 of substrate 4, includes a second surface 5. Second surface 5 is similarly metallicized, albeit without electrical circuiting imposed thereon. The surface 5 is provided with electrically conductive members generally indicated at 12. In a preferred embodiment, these members comprise solder balls 13. The solder balls 13, constituting the electrically conductive members, preferably comprise an alloy of lead and tin. More preferably, the solder balls comprise an alloy of 90% lead and 10% tin. The electrically conductive members 12 provide electrical communication between the flexible substrate 4 and a circuit board 2. Electrical conductivity is provided by means of pads 7 on circuit board 2. Each pad 7 is preferably provided with a solder paste 11. The paste 11 is again an alloy of lead and tin wherein the tin constituent is significantly higher to reduce the melting point of the solder. For example, a solder paste constituting 63% lead and 37% tin, said percentages being by weight, represents a preferable embodiment.

Returning to the first surface 6 of substrate 4, the inclusion thereon of electrically conductive rivets 15 is a result of the inclusion of the solder balls 13 on surface 5. These rivets are formed concurrent with the disposition on surface 6 of solder balls 13. That is, the solder balls 13 are heated, resulting in the flow of molten metal through vias 9. The overflow forms rivets 15. This fabrication results in the secure fastening of the solder balls 13 to the flex substrate 4 and also provides complete electrical communication between the flexible substrate 4 and the electrically conducting members with which it communicates.

The rivets 15 usually have a height of at least about 100 microns. Indeed, the height may be as high as about 150 microns, however, a height of approximately 125 microns is usual.

As illustrated in the drawings, the flexible substrate 4 is in direct communication, and obviously in electrical communication, with a semiconductor chip 8. This electrical communication is provided by electrical connector 21, provided on flexible substrate 4, being in contact with pad 23 provided on semiconductor chip 8. Thus, the information generated in the circuitry of chip 8 is electrically communicated, through the circuitry on the flexible substrate 4, by means of solder balls 13 and electrical pads 7, to the circuit board 2.

The very thin nature of the flexible substrate 4 emphasizes the requirement that it be structurally supported. This support is provided by a stiffener 10. The stiffener 10 is not restricted to any specific class of material. All that the material need provide is adequate strength such that the flexible substrate 4 is mechanically supported. The stiffener 10, however, is preferably a metal, more preferably, copper and even more preferably, nickel-plated copper.

Obviously, the flexible substrate 4 must be bonded to the stiffener 10. In addition to the requirement that the adhesive used to bond the two elements be strong and heat resistant, the adhesive must also be highly conformable to the irregular shape of the first surface 6 of the flexible substrate 4. Surface 6 includes rivet heads 15 which thus provide an irregularly shaped surface. More importantly, this conformance must be consistent with the absence of electrical communication between the flexible substrate 4 and the stiffener 10, insofar as contact therebetween would result in shorting out of the electrical circuit. Shorting out of the circuit, of course, occurs when there is electrical communication between the electrically conductive rivets 15 and stiffener 10.

An adhesive composition 20 provides the critical bonding between flexible substrate 4 and stiffener 10 without electrical communication therebetween. The adhesive composition 20 includes a microporous plastic film substrate. As mentioned earlier, film adhesives of the prior art, such as adhesives laden on fiberglass, do not provide the requisite conformability so that air is trapped between the flexible substrate 4 and the stiffener 10. The trapped air serves as paths for the introduction of fluids. The employment of the unique microporous film of the present invention permits the entrapped air to escape through the micropores without the concurrent introduction of liquids.

In a preferred embodiment, the microporous plastic film substrate is a highly heat resistant material. Among the preferred plastics useful in the adhesive of this invention, polyfluorocarbon and polyolefin resins are preferred. Thus, such polymers as polytetrafluoroethylene, commonly referred to by a well known trademark, Teflon, and polypropylene are particularly preferred. More preferably, the microporous film substrate is polytetrafluoroethylene.

In the preferred embodiment wherein a polytetrafluoroethylene microporous film is employed as the substrate of the adhesive composition, the film may be a polytetrafluoroethylene homopolymer, a copolymer of tetrafluoroethylene and a perfluoroether, e.g. perfluoropropylvinyl, and a copolymer of tetrafluoroethylene and hexafluoropropylene.

The microporous plastic film substrate is laden with a curable resin which acts as the adhesive. Any thermosetting adhesive utilized in high temperature electrical applications may be utilized in the present invention. This adhesive, which fills the pores of the microporous film, may be any one of the commonly employed adhesives used in the fabrication of chip assemblies. For example, the adhesive may be a silicone resin, a butadiene resin, an acrylic resin or the like. Preferably, the adhesive utilized in the present invention is a silicone resin or a polybutadiene resin. Most preferably, a polybutadiene resin is employed.

The adhesive composition of the present invention, in a preferred embodiment, includes between about 15% and about 40% by weight of a curable adhesive, based on the total weight of the adhesive and substrate. The substrate of the adhesive composition is characterized by a void volume of between about 50% and about 95%, preferably between about 75% and about 85%.

The microporous film, laden with a curable adhesive, prior to installation, has a thickness of between about 200 microns and about 250 microns. This thickness is adequate to prevent contact between the rivet heads 15 and the stiffener 10. As stated above, the rivet heads 15 have a height of approximately 100 to 150 microns.

Although the adhesive film of the present invention is affected by the thermodynamic conditions under which the curable resin is thermoset, i.e. elevated temperature and pressure, the adhesive composition of the present invention maintains adequate dimensional stability to prevent electrical contact between the stiffener 10 and the flexible substrate 4. These thermodynamic conditions are discussed below in the discussion of the process of making the assembly.

Suffice it to say, the completed assembly incorporates an adhesive, in accordance with the present invention, disposed between the stiffener 10 and the flexible substrate 4, having a thickness of between about 175 microns and about 200 microns.

The chip carrier assembly 1 is completed with the disposition thereon of a cover plate 14. The cover plate 14 principally acts as a heat sink to absorb the high temperatures evolved in the flow of electricity upon the semiconductor chip 8. Obviously, electrical flow in the electrical paths provided on the flexible substrate 4 generates heat. However, the heat generated from electrical flow in the flexible circuit is not nearly as great as that generated upon the semiconductor chip. Moreover, most of the heat generated by the electrical flow that occurs on the flexible substrate 4 is absorbed by the stiffener 10.

The cover plate 14 is connected to the chip 8 and to the stiffener 10 by adhesives. A thermal adhesive 16 is utilized to bond the chip 8 to the cover plate 14. Those skilled in the art are aware of appropriate thermal adhesives that can be used in this application. A preferred thermal adhesive, useful in this application, is a silicone resin. The adhesive used to provide a bond between the cover plate 14 and the stiffener 10, as depicted at 18, may be any suitable adhesive. For example, the adhesive employed to bond the stiffener 10 to the flexible substrate 4 may be utilized to bond the stiffener 10 to the cover plate 14. Alternatively, the thermal adhesive 16, utilized to bond the cover plate 14 to the semiconductor chip 8, i.e. a silicone adhesive, may be employed in this application. It is emphasized, however, that adhesive 18 does not require the thermal resistance property required of adhesive 16. Very little heat is given off by stiffener 10, which itself absorbs substantially all of the heat evolved from the electrical flow on the flexible substrate 4.

The semiconductor chip 8 may be provided with an encapsulant 17. The encapsulant 17 insures mechanical protection of the electrical connection between electrical connector 21 on the flexible substrate and contact pad 23 of chip 8. This encapsulant is composed of an electrically insulating material well known in the art.

Figure 2:
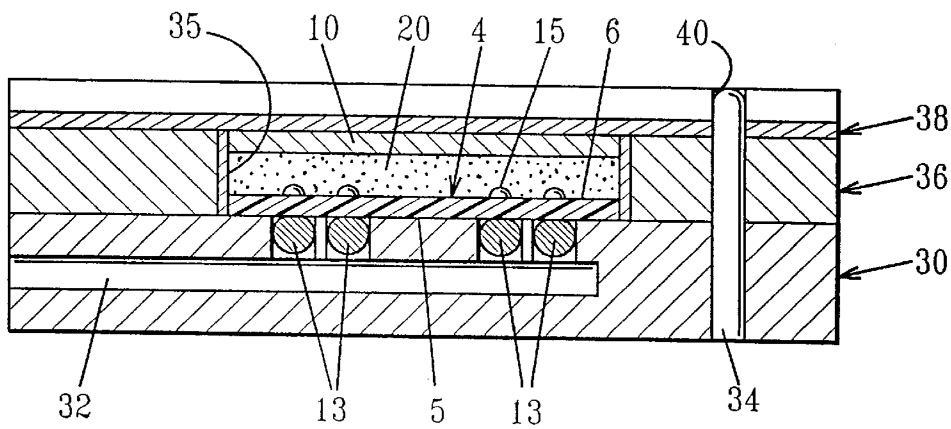
FIG. 2 is a cross-sectional front elevation view of portions of the chip carrier assembly disposed in a vacuum fixture.

Turning to the process of fabricating the chip carrier assembly 1, especially the bonding of the flexible substrate 4 to the stiffener 10, attention is directed to FIG. 2. In this fabrication, a vacuum fixture, generally indicated by reference numeral 30, is utilized. A flexible substrate 4, having solder balls 13 disposed on its bottom surface 5, is placed in the fixture 30 and held thereon by the application of a vacuum. It is emphasized that the fixture is provided with openings to accommodate these irregularities, i.e. solder balls. The vacuum is provided by a source (not shown) in communication with a vacuum conduit 32. The substrate 4, is thus maintained flat and stationary. A microporous adhesive 20, composition cut to the size of the flexible substrate 4, is disposed over the top surface 6 of the substrate 4. A stiffener 10 is placed over the adhesive 20 composition by means of a locator plate 36. A compression plate 38 is disposed over the stiffener 10 and the locator plate 36. Alternatively, the microporous adhesive composition 20 can be aligned and laminated to the stiffener 10. The laminated stiffener is thereupon placed over the flexible substrate 4, again by means of the locator plate 36. The compression plate 38 may be provided with edge surfaces 35 to insure containment of the adhesive. Both the locator and compression plates are preferably constructed of stainless steel. It is emphasized that all the aforementioned members are maintained in register by means of alignment holes 40 provided on the vacuum fixture 30, the locator plate 36 and the compression plate 38. These members are held together in the requisite position by means of a locator dowel 34.

The stiffener 10 is bonded to flexible substrate 4 by means of the application of heat and pressure. The assembly, disposed in the vacuum fixture 30, is subjected to heat and pressure to cure the curable adhesive disposed in the pores of the microporous film. The thermodynamic conditions imposed in the curing step is a function of the specific curable adhesive employed in the curable composition. In a preferred embodiment, curing occurs at a temperature in the range of between about 135° C. and about 190° C. under a pressure of between about 10 psi and about 1,000 psi. This curing occurs over a period of about 5 minutes to about 1 hour. More preferably, curing occurs at a temperature in the range of between about 140° C. and about 160° C. under a pressure of between about 20 psi and about 200 psi for a period of between about 20 minutes and about 45 minutes. In the event that curing occurs over a period of less than 30 minutes, it is preferred that the assembly be post baked at the temperature at which curing occurred.

The above detailed description is given to illustrate the scope and spirit of the present invention. This detailed description will make apparent, to those skilled in the art, other embodiments and examples. Those other embodiments and examples are within the contemplation of the present invention. Therefore, the present invention should be limited only by the appended claims.

What is claimed is:

1. A semiconductor chip carrier assembly comprising:

a flexible substrate having a first and a second surface, said first surface including electrically conductive rivets and metallicized paths to provide electrical conductivity therethrough and said second surface including electrically conductive members;

a semiconductor chip in electrical communication with said flexible substrate;

a stiffener, provided with a first surface and a second surface, to support said flexible substrate, said stiffener disposed adjacent to said first surface of said flexible substrate;

an adhesive composition comprising a microporous film substrate, laden with a curable adhesive, disposed between said first surface of said flexible substrate and said first surface of said stiffener; and a cover plate adhesively bonded to said semiconductor chip and said second surface of said stiffener.

2. An assembly in accordance with claim 1 wherein said microporous film is a plastic film having a thickness of up to about 250 microns, said film provided with a multiplicity of pores providing a pore volume of between about 50% and about 95%.

3. An assembly in accordance with claim 2 wherein said curable adhesive of said adhesive composition is selected from the group consisting of a butadiene resin, a silicone resin and an acrylic resin.

4. An assembly in accordance with claim 3 wherein said microporous film substrate of said adhesive composition is a film of a polymer selected from the group consisting of polyfluorocarbons and polyolefins.

5. An assembly in accordance with claim 4 wherein said polymer of said microporous film substrate is selected from the group consisting of polytetrafluoroethylene and polypropylene.

6. An assembly in accordance with claim 5 wherein said microporous film substrate is formed of polytetrafluoroethylene.

7. An assembly in accordance with claim 6 wherein said polytetrafluoroethylene microporous film is selected from the group consisting of a polytetrafluoroethylene homopolymer, a copolymer of tetrafluoroethylene and a perfluoroether and a copolymer of tetrafluoroethylene and hexafluoropropylene.

8. An assembly in accordance with claim 3 wherein said curable adhesive of said adhesive composition is a butadiene resin.

9. An assembly in accordance with claim 1 wherein said adhesive composition comprises between about 15% and about 40% by weight of said curable adhesive, based on the total weight of said adhesive composition.

10. An assembly in accordance with claim 1 wherein said electrically conductive members are solder balls.

11. An assembly in accordance with claim 10 wherein said solder balls are an alloy of about 90% lead and 10% tin.

12. An assembly in accordance with claim 1 wherein flexible substrate is a polyimide film whose first and second surface is metallicized.

13. An assembly in accordance with claim 12 wherein said metallicized polyimide film has a thickness in the range of between about 40 microns and about 60 microns.

14. An assembly in accordance with claim 13 wherein said rivets on said first surface of said flexible substrate have a height in the range of between about 125 microns and about 175 microns and wherein said metallicized paths on said first surface has a height in the range of between about 100 microns and about 150 microns.

* * * * *